US009024452B2

(12) United States Patent
Chun

(10) Patent No.: US 9,024,452 B2
(45) Date of Patent: May 5, 2015

(54) SEMICONDUCTOR PACKAGE COMPRISING AN INTERPOSER AND METHOD OF MANUFACTURING THE SAME

(75) Inventor: Jung Hwan Chun, Chungcheongnam-Do (KR)

(73) Assignee: STS Semiconductor & Telecommunications Co., Ltd. (KR)

( * ) Notice: Subject to any disclaimer, the term of this patent is extended or adjusted under 35 U.S.C. 154(b) by 302 days.

(21) Appl. No.: 13/479,971

(22) Filed: May 24, 2012

(65) Prior Publication Data

US 2013/0015571 A1 Jan. 17, 2013

(30) Foreign Application Priority Data

Jul. 13, 2011 (KR) .................. 10-2011-0069473

(51) Int. Cl.
*H01L 23/538* (2006.01)
*H01L 25/065* (2006.01)
(Continued)

(52) U.S. Cl.
CPC .......... *H01L 25/0657* (2013.01); *H01L 21/563* (2013.01); *H01L 25/074* (2013.01); *H01L 23/3128* (2013.01); *H01L 23/49816* (2013.01); *H01L 2224/16145* (2013.01); *H01L 2224/32225* (2013.01); *H01L 2224/48145* (2013.01); *H01L 2224/48227* (2013.01);
(Continued)

(58) Field of Classification Search
CPC ....... H01L 21/563; H01L 24/14; H01L 24/17; H01L 24/73; H01L 24/92; H01L 25/043; H01L 25/074; H01L 25/0657; H01L 2225/06513

USPC .......... 257/686, 737, 778, E23.021, E25.013, 257/E21.511; 438/108
See application file for complete search history.

(56) References Cited

U.S. PATENT DOCUMENTS 6,930,378 B1 * 8/2005 St. Amand et al. ........... 257/686
2002/0125556 A1 * 9/2002 Oh et al. ....................... 257/685
2010/0314730 A1 12/2010 Labeeb

FOREIGN PATENT DOCUMENTS

JP 2005285997 A 10/2005
KR 20090019297 A 2/2009

OTHER PUBLICATIONS

English machine translation of JP2005-285997A to Kawano et al.*
(Continued)

*Primary Examiner* — Tom Thomas
*Assistant Examiner* — Christopher M Roland
(74) *Attorney, Agent, or Firm* — St. Onge Steward Johnston & Reens LLC

(57) ABSTRACT

A semiconductor package and a method of manufacturing the same. The semiconductor package includes; a printed circuit board (PCB); a first semiconductor chip attached onto the PCB; an interposer that is attached onto the first semiconductor chip to cover a portion of the first semiconductor chip and comprises first connection pad units and second connection pad units that are electrically connected to each other, respectively, on an upper surface opposite to a surface of the interposer facing the first semiconductor chip; a second semiconductor chip attached onto the first semiconductor chip and the interposer as a flip chip type; a plurality of bonding wires that electrically connect the second connection pad units of the interposer to the PCB or the first semiconductor chip to the PCB; and a sealing member formed on the PCB to surround the first semiconductor chip, the second semiconductor chip, the interposer, and the bonding wires.

9 Claims, 9 Drawing Sheets

(51) Int. Cl.
    *H01L 25/07*     (2006.01)
    *H01L 23/00*     (2006.01)
    *H01L 21/56*     (2006.01)
    *H01L 23/31*     (2006.01)
    *H01L 23/498*     (2006.01)

(52) U.S. Cl.
    CPC ...... *H01L 2224/73265* (2013.01); *H01L 24/17* (2013.01); *H01L 2224/48091* (2013.01); *H01L 2224/49113* (2013.01); *H01L 2924/01029* (2013.01); *H01L 2924/15311* (2013.01); *H01L 2224/92242* (2013.01); *H01L 24/14* (2013.01); *H01L 24/73* (2013.01); *H01L 24/92* (2013.01); *H01L 2224/1403* (2013.01); *H01L 2224/16227* (2013.01); *H01L 2224/1703* (2013.01); *H01L 2224/2919* (2013.01); *H01L 2224/33181* (2013.01); *H01L 2224/73203* (2013.01); *H01L 2224/73215* (2013.01); *H01L 2224/92247* (2013.01); *H01L 2225/0651* (2013.01); *H01L 2225/06517* (2013.01); *H01L 2225/06513* (2013.01); *H01L 2225/06506* (2013.01); *H01L 2225/06572* (2013.01); *H01L 2224/16225* (2013.01); *H01L 2924/1461* (2013.01)

(56) References Cited

OTHER PUBLICATIONS

Office Action Type: Notice of Allowance, Country: Korea, Application No. 10 2011 0069473, Issued: Oct. 23, 2012, pp. 1.

\* cited by examiner

SEMICONDUCTOR PACKAGE COMPRISING AN INTERPOSER AND METHOD OF MANUFACTURING THE SAME

CROSS-REFERENCE TO RELATED APPLICATIONS

This application claims the benefit of Korean Patent Application No. 10-2011-0069473, filed on Jul. 13, 2011, in the Korean Intellectual Property Office, the disclosure of which is incorporated herein in its entirety by reference.

FIELD OF THE INVENTION

The present invention relates to a semiconductor package and a method of manufacturing the same, and more particularly, to a semiconductor package in which a semiconductor chip that is connected in a flip chip type and a semiconductor chip that is connected by a bonding wire are stacked together and a method of manufacturing the same.

BACKGROUND OF THE INVENTION

As the functions of electronic products are combined, the demand for a semiconductor package in which instead of a single semiconductor chip a plurality of semiconductor chips are stacked has increased. Many electrical connection methods, such as flip chip types or bonding wires, have been developed to connect the semiconductor chips of the same type.

However, in order to stack a semiconductor chip connected by a bonding wire on a semiconductor chip that is connected by a flip chip type, damage to a bump of the semiconductor chip that is connected in a flip chip type may occur in a process of forming the bonding wire. Accordingly, there are difficulties in manufacturing semiconductor packages by freely stacking various types of semiconductor chips.

SUMMARY OF THE INVENTION

The present invention provides a semiconductor package formed by stacking a semiconductor chip connected in a flip chip type and a semiconductor chip connected by bonding wires, and a method of manufacturing the same.

According to an aspect of the present invention, there is provided a semiconductor package including: a printed circuit board (PCB); a first semiconductor chip attached onto the PCB; an interposer that is attached onto the first semiconductor chip to cover a portion of the first semiconductor chip and comprises first connection pad units and second connection pad units that are electrically connected to each other, respectively, on an upper surface opposite to the surface of the interposer facing the first semiconductor chip; a second semiconductor chip attached onto the first semiconductor chip and the interposer as a flip chip type; a plurality of bonding wires that electrically connect the second connection pad units of the interposer to the PCB or the first semiconductor chip to the PCB; and a sealing member formed on the PCB to surround the first semiconductor chip, the second semiconductor chip, the interposer, and the bonding wires.

The first semiconductor chip may include a plurality of pads on a first active surface opposite to a surface facing the PCB, and each of the pads may include first pad units connected to the second semiconductor chip and second pad units connected to the bonding wires, whereas the first pad units and the second pad units are electrically connected to each other, respectively.

The second semiconductor chip may include: first bump units that are formed on a second active surface that faces the first semiconductor chip and the interposer and are connected to the first pad units of the first semiconductor chip and second bump units that are connected to the first connection pad units of the interposer, and the first bump units may have a height greater than that of the second bump units.

The interposer may have a thickness smaller than the height of the first bump units.

The interposer may be attached onto the first semiconductor chip separate from the pads of the first semiconductor chip, and the second semiconductor chip may be attached onto the first semiconductor chip and the interposer exposing the second connection pad units of the interposer.

The first bump units of the second semiconductor chip may be disposed on the upper surface of the interposer separate from edges of the upper surface.

The semiconductor package may further include: a third semiconductor chip attached onto the second semiconductor chip; and a plurality of additional bonding wires that electrically connect the PCB to the third semiconductor chip or the second connection pad units of the interposer to the third semiconductor chip, and the sealing member is formed to surround the third semiconductor chip and the additional bonding wires.

According to an aspect of the present invention, there is provided a method of manufacturing a semiconductor package, the method may include: preparing a first semiconductor chip that comprises a plurality of pads each comprising first pad units and second pad units, which are electrically connected to each other, respectively; attaching the first semiconductor chip onto a PCB exposing the pads; attaching an interposer that comprises a plurality of pads each having a first connection pad unit and a second connection pad unit that are electrically connected to each other, respectively, on the first semiconductor chip exposing the pads; attaching a second semiconductor chip that is connected to the first pad units of the first semiconductor chip and the first connection pad units of the interposer as a flip chip type; forming bonding wires that electrically connect the second pad units of the first semiconductor chip to the PCB or the second connection pad units to the PCB; and forming a sealing member on the PCB to surround the first and second semiconductor chips, the interposer, and the bonding wire.

The second semiconductor chip may include first bumps and second bumps, and the attaching of the second semiconductor chip may include connecting the first bumps to the first bump units and the second bumps to the first connection pad units.

The preparing of the first semiconductor chip may include performing an EDS inspection on the first semiconductor chip through the first pad units.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
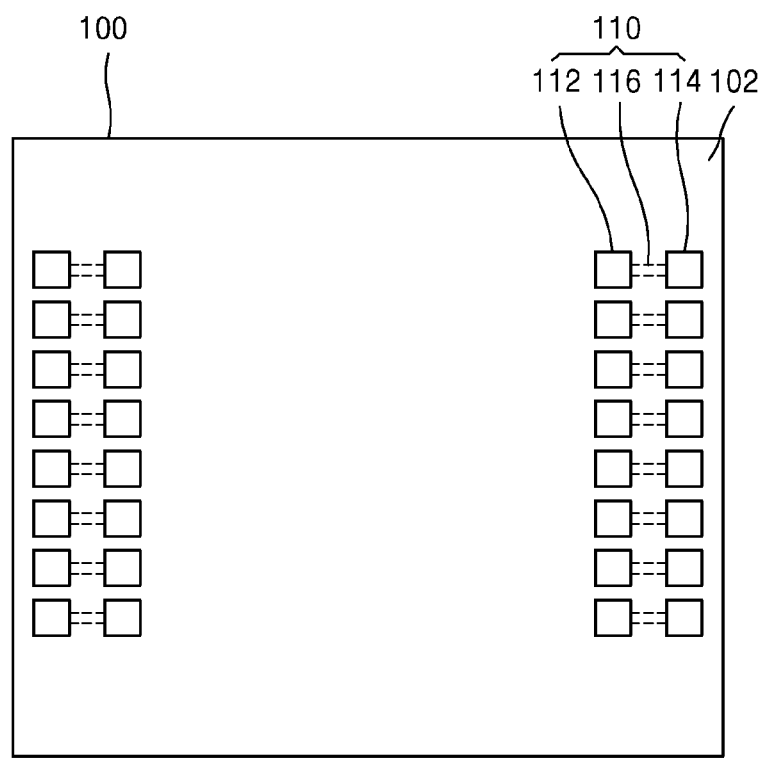
FIG. 1 is a plan view of a first semiconductor chip according to an embodiment of the present invention.

Hereafter, the present invention will be described more fully with reference to the accompanying drawings, in which exemplary embodiments of the present invention are shown. However, the present invention is limited thereto and it will be understood by those of ordinary skill in the art that various changes in form and details may be made therein without departing from the spirit and scope of the present invention. That is, in describing the present invention, when practical descriptions with respect to related known function and configuration are provided to describe the exemplary embodiments of the present invention and the present invention may be embodied in various ways and not be construed as limited to the exemplary embodiments set forth herein. It should be understood, however, that there is no intent to limit exemplary embodiments to the particular forms disclosed, but on the contrary, exemplary embodiments are to cover all modifications, equivalents, and alternatives falling within the scope of the invention.

It will be understood that, although the terms first and second, etc., may be used herein to describe various constituent elements, the present invention is not limited by these terms. These terms are only used to distinguish one element from another element. For example, without departing from the teachings of the inventive concept, a first constituent element may be referred to as a second constituent element, and similarly, the second constituent element may be referred to as the first constituent element.

It will be understood that when an element is referred to as being "connected to" or "contacted with" another element, the element may be directly connected to or contacted with another element, or another constituent element may intervene the elements. In contrast, when an element is referred to as being "directly connected to" or "contacted with" another element, there are no intervening element between the elements. Other expressions for describing relationships between elements, such as "between~" and "directly between~" or "adjacent to ~" and "directly adjacent to~" may also be interpreted the same way.

The terminology used herein is for the purpose of describing particular embodiments only and is not intended to be limiting of the invention. The singular forms include the plural forms unless the context clearly indicates otherwise. It will further understood that the terms "comprise" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal senses unless expressly so defined herein.

FIG. 1 is a plan view of a first semiconductor chip 100 according to an embodiment of the present invention.

Referring to FIG. 1, a plurality of pads 110 are formed on a first active surface 102, which is an upper surface of the first semiconductor chip 100. The pads 110 may be arranged on the first active surface 102 close to both facing edges of the first active surface 102. Each of the pads 110 may include a first pad unit 112 and a second pad unit 114.

The first pad unit 112 and the second pad unit 114 may be electrically connected to each other by a pad connection unit 116. The pad connection unit 116 may be formed on the first active surface 102 to be exposed together with the first pad unit 112 and the second pad unit 114. Alternatively, the pad connection unit 116 on a lower surface of the first active surface 102 may electrically connect the first pad unit 112 and the second pad unit 114, and in this case, an insulating layer may be formed on the pad connection unit 116.

Alternatively, the first pad unit 112 and the second pad unit 114 may be formed directly connected to each other as one body. In this case, the first pad unit 112 and the second pad unit 114 may be differentiated by a functional difference which is described below.

Figure 2:
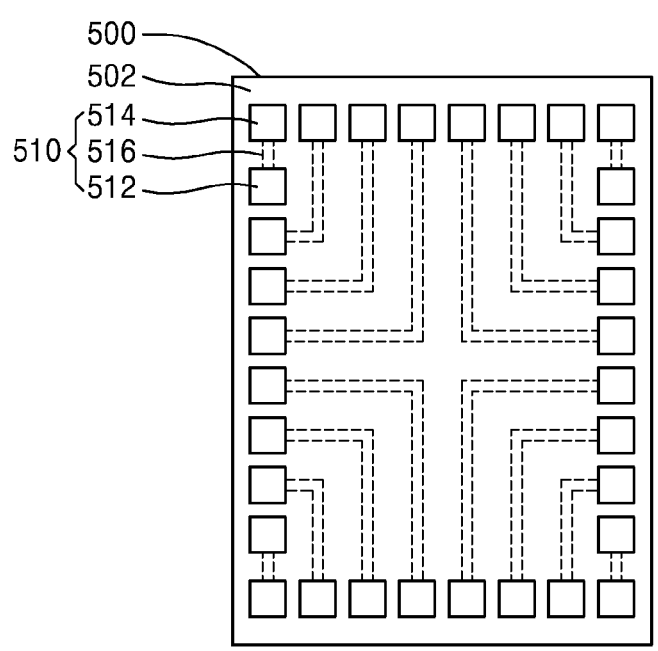
FIG. 2 is a plan view showing an interposer according to an embodiment of the present invention.

FIG. 2 is a plan view showing an interposer 500 according to an embodiment of the present invention.

Referring to FIG. 2, a plurality of connection pads 510 are formed on an upper surface 502 of the interposer 500. Each of the connection pads 510 may include a first connection pad unit 512 and a second connection pad unit 514. The interposer 500 may be a silicon substrate on which a conductive pad is formed or a printed circuit board (PCB).

The first connection pad unit 512 and the second connection pad unit 514 may be electrically connected by a pad extension unit 516. The pad extension unit 516 may be formed on the upper surface 502 of the interposer 500 to be exposed together with the first connection pad unit 512 and the second connection pad unit 514. Alternatively, the pad extension unit 516 on a lower side of the upper surface 502 may electrically connect the first connection pad unit 512 and the second connection pad unit 514, and in this case, an insulating layer may be formed on the pad extension unit 516.

The first connection pad units 512 may be arranged on the upper surface 502 of the interposer 500 adjacent both facing edges of the upper surface 502. The second connection pad units 514 may be formed on the upper surface 502 of the interposer 500 adjacent both different facing edges of the upper surface 502. The pad extension units 516 may electrically connect the first connection pad units 512 and the second connection pad units 514 which are disposed on the upper surface 502 of the interposer 500 adjacent both different edges of the upper surface 502.

Figure 3:
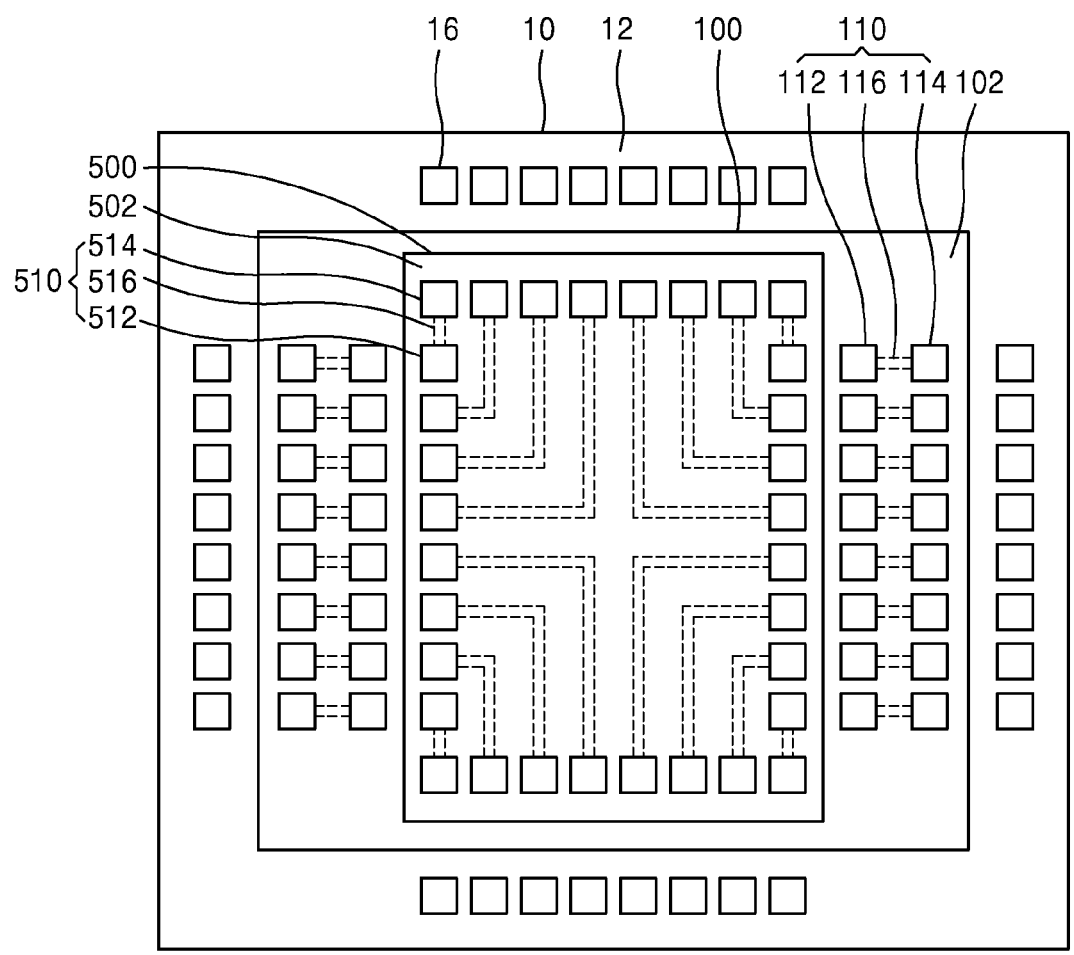
FIG. 3 is a plan view showing an operation of attaching a first semiconductor chip and an interposer onto a printed circuit board (PCB) according to an embodiment of the present invention.

FIG. 3 is a plan view showing an operation of attaching the first semiconductor chip 100 and the interposer 500 onto a printed circuit board (PCB) 10 according to an embodiment of the present invention.

Referring to FIG. 3, the first semiconductor chip 100 is attached onto a surface 12 of the PCB 10. The interposer 500 is attached on the first active surface 102 opposite to a surface of the first semiconductor chip 100 that faces the PCB 10.

A plurality of connection terminal units 16 may be formed on the surface 12 of the PCB 10. The first semiconductor chip 100 may be attached to the surface 12 of the PCB 10 on which the connection terminal units 16 are exposed. A plurality of external connection units 18 may be formed on another surface 14 of the PCB 10 (see FIG. 5). At least one of the connection terminal units 16 may be electrically connected to at least one of the external connection units 18.

The PCB 10 may be formed such that the connection terminal units 16, which are conductive patterns, are formed on a base substrate. The base substrate may be formed of an insulating material, for example, a rigid material such as bismaleimide triazine (BT) resin or frame retardant 4 (FR4). Also, the base substrate may be formed of a flexible material, such as poly imide (PI) or poly ester (PET). The connection terminal units 16 may be formed by partly plating a material, such as Ni or Au, on a pattern formed of a metal, such as copper.

The interposer 500 may be attached onto the first active surface 102 of the first semiconductor chip 100 separately from the pads 110 to expose the pads 110 formed on the first active surface 102 of the first semiconductor chip 100. An area of the upper surface 502 of the interposer 500 may be smaller than that of the first active surface 102 of the first semiconductor chip 100.

The first semiconductor chip 100 may include a highly integrated semiconductor memory device, such as DRAM, SRAM, or a flash memory, a processor, such as a central processor unit (CPU), a digital signal processor (DSP), or a combination of a CPU and a DSP, or individual semiconductor devices that constitute an application specific integrated circuit (ASIC), a micro electro mechanical system (MEMS) device, or an optoelectronic device. The first semiconductor chip 100 may be formed by separating a semiconductor wafer (not shown) after back-grinding or back lapping the semiconductor wafer on which individual semiconductor devices are formed.

In FIG. 3, the interposer 500 is depicted attached onto the first semiconductor chip 100 to completely overlap with the first semiconductor chip 100. However, the interposer 500 may extend over one of the four edges of the first active surface 102 of the first semiconductor chip 100 where the pads 110 are not formed. However, in this case, all of the connection terminal units 16 of the PCB 10 may be exposed by the interposer 500.

Figure 4:
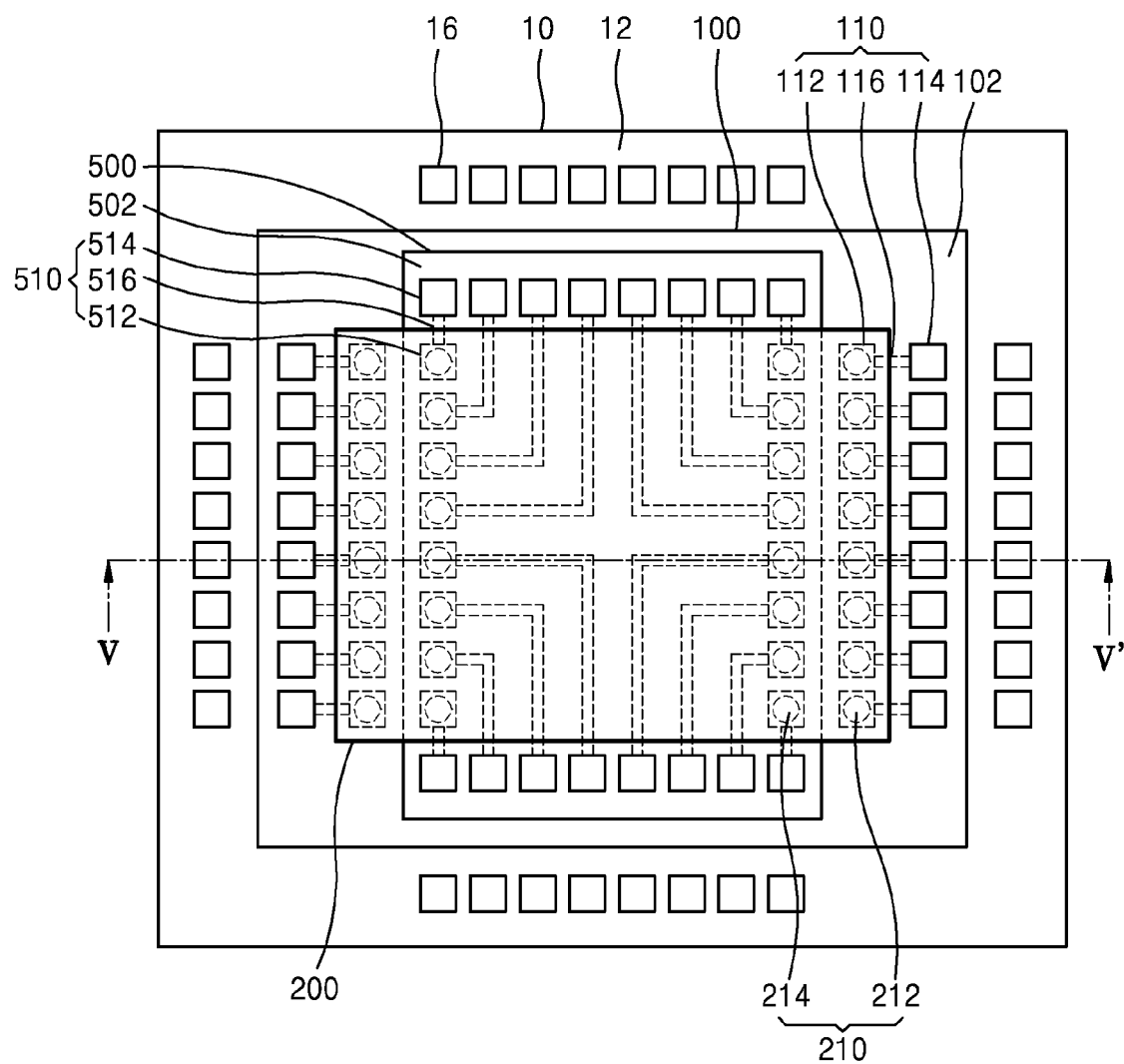
FIGS. 4 and 5 are a plan view and a cross-sectional view showing an operation of attaching a second semiconductor chip onto a first semiconductor chip and an interposer, respectively, according to an embodiment of the present invention.
Figure 5:
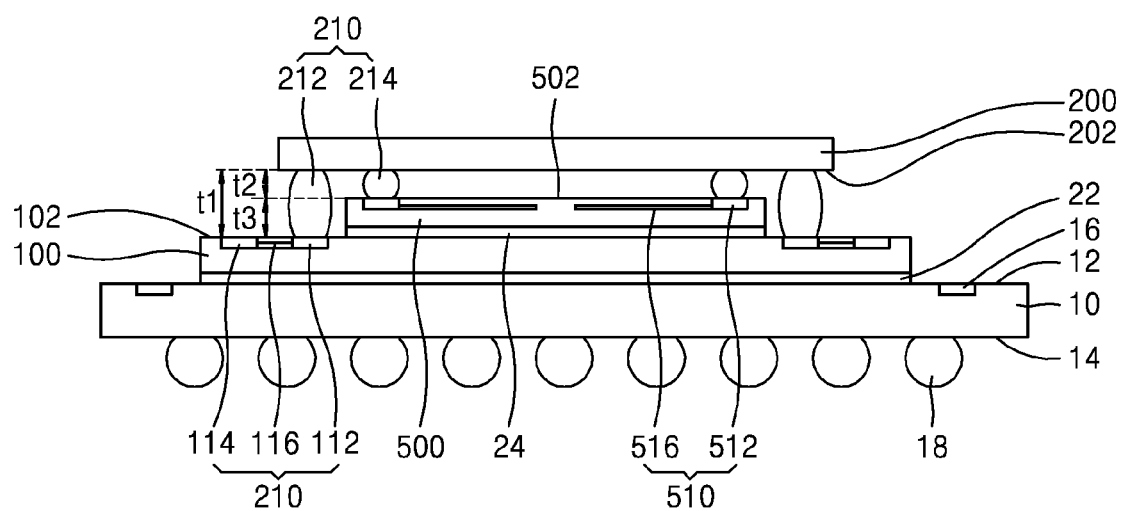

FIGS. 4 and 5 are a plan view and a cross-sectional view showing an operation of attaching a second semiconductor chip 200 onto the first semiconductor chip 100 and the interposer 500, respectively, according to an embodiment of the present invention. More specifically, FIG. 5 is a cross-sectional view taken along the line V-V' of FIG. 4. Also, in FIG. 4, for convenience of explanation, the lower side of the second semiconductor chip 200 is depicted as a perspective plan.

Referring to FIGS. 4 and 5, the second semiconductor chip 200 is attached onto the first semiconductor chip 100 and the interposer 500. The second semiconductor chip 200 may be attached onto the first semiconductor chip 100 and the interposer 500 as a flip chip type. The second semiconductor chip 200 may be attached onto the first semiconductor chip 100 and the interposer 500 on which the second connection pad unit 514 of the interposer 500 and the second pad unit 114 of the first semiconductor chip 100 are exposed.

The first semiconductor chip 100 may be attached onto the PCB 10 by using a first adhesive member 22. The interposer 500 may be attached onto the first semiconductor chip 100 by using a second adhesive member 24. The first and second adhesive members 22 and 24 may be films on which an epoxy resin or an adhesive member is coated or films having adhesiveness.

The second semiconductor chip 200 may include a plurality of bumps 210 on a second active surface 202 that faces the first semiconductor chip 100 and the interposer 500. Each of the bumps 210 may include a first bump unit 212 and a second bump unit 214. The first bump unit 212 may be electrically connected to the first pad unit 112 of the first semiconductor chip 100 by contacting each other. The second bump unit 214 may be electrically contacted to the first connection pad unit 512 of the interposer 500 by contacting each other.

A first height t1, which is the height of the first bump unit 212, may have a value greater than that of a second height t2, which is a height of the second bump unit 214. The first height t1, which is the height of the first bump unit 212, may have a value equal to the sum of the value of height t2, which is the height of the second bump unit 214, and a value of height t3, which is a height of the interposer 500. That is, the height t3 of the interposer 500, that is, the thickness of the interposer 500, may have a value smaller than that of the first height t1, which is the height of the first bump unit 212.

The first bump unit 212 may be disposed separately from an edge of the upper surface 502 of the interposer 500 to be connected to the first bump unit 212. That is, the second semiconductor chip 200 may be attached onto the first semiconductor chip 100 and the interposer 500 with the first bump unit 212 disposed separately from the edge of the upper surface 502 of the interposer 500.

The second semiconductor chip 200 may include a highly integrated semiconductor memory devices such as a DRAM, SRAM, or a flash memory, processors, such as a CPU, a DSP, or a combination of a CPU and a DSP, or individual semiconductor devices that constitute an ASIC, an MEMS device, or an optoelectronic device.

Figure 6:
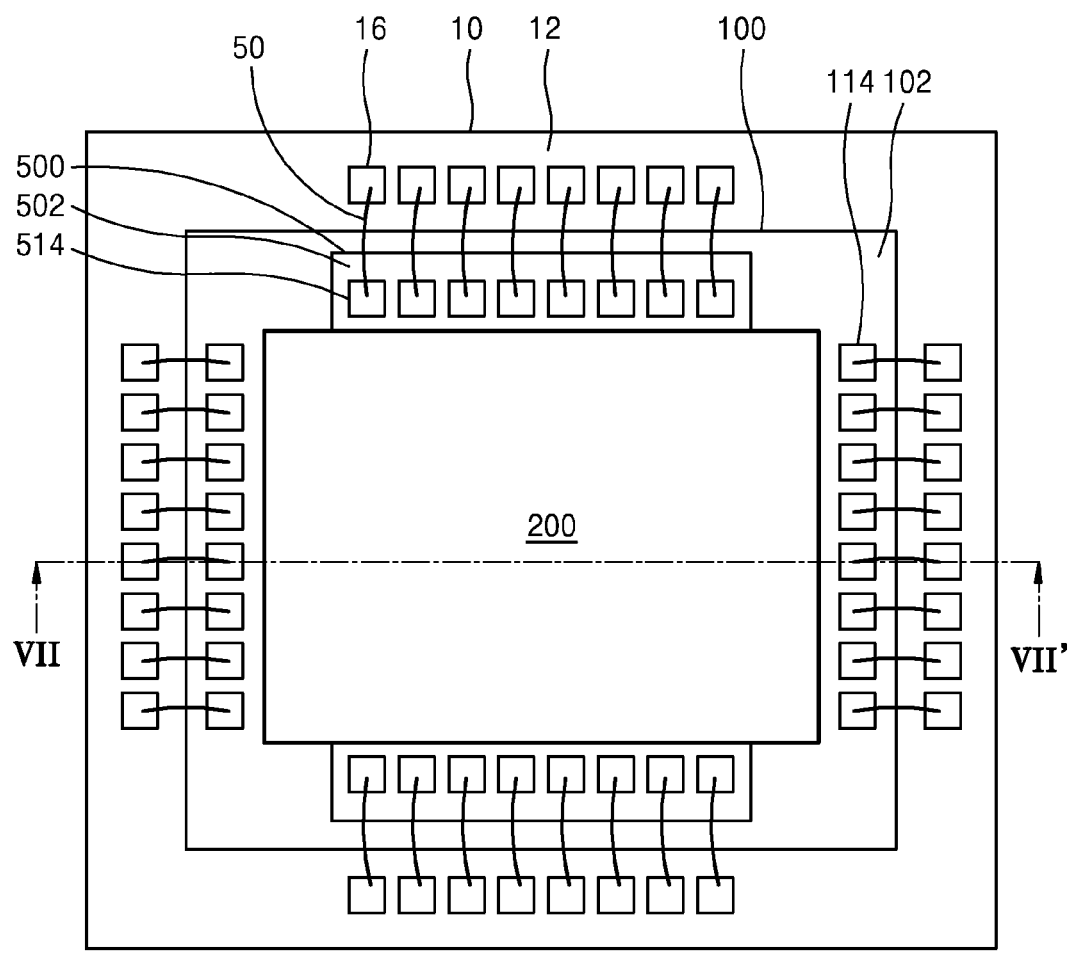
FIG. 6 is a plan view showing an operation of forming a bonding wire according to an embodiment of the present invention.

FIG. 6 is a plan view showing an operation of forming a bonding wire 50 according to an embodiment of the present invention.

Referring to FIG. 6, bonding wires 50 that electrically connect between the first semiconductor chip 100 and the PCB 10 and between the interposer 500 and the PCB 10 are formed. The bonding wire 50 may be formed of a conductive metal. The bonding wire 50 may be formed of Au or an alloy containing Au. The bonding wire 50 may include a metal having high conductivity, such as Ag or Cu.

The bonding wire 50 is not directly connected to the second semiconductor chip 200. Accordingly, in a process of forming the bonding wire 50, a pressure is not applied to the bumps 210 of the second semiconductor chip 200 shown in FIG. 5. Therefore, there is no damage to the bumps 210.

The bonding wires 50 may electrically connect the second pad units 114 of the first semiconductor chip 100 to the connection terminal units 16 of the PCB 10. The bonding wires 50 may electrically connect the second connection pad units 514 of the interposer 500 to the connection terminal units 16 of the PCB 10.

Figure 7:
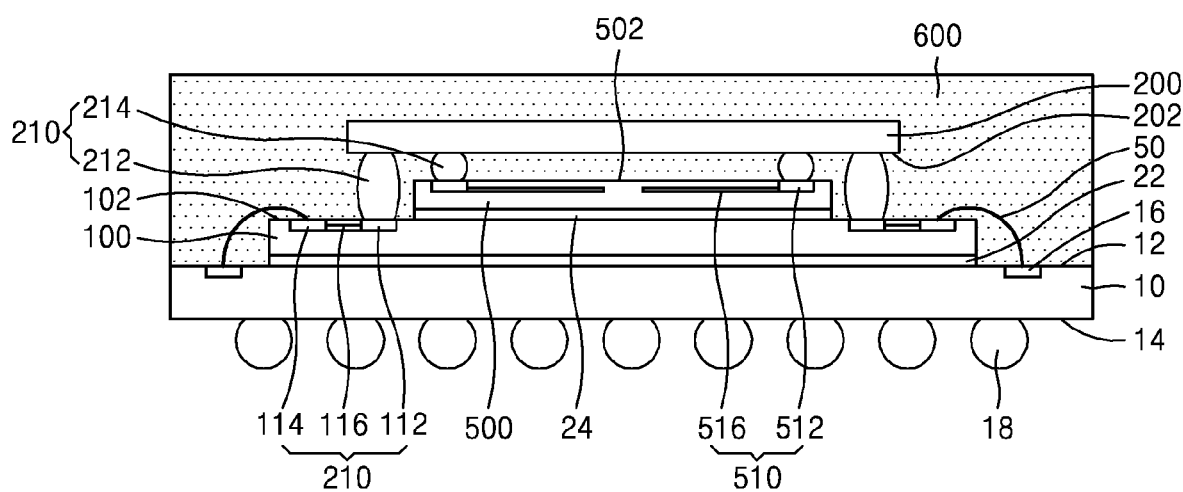
FIG. 7 is a cross-sectional view showing an operation of forming a sealing member according to an embodiment of the present invention.

FIG. 7 is a cross-sectional view showing an operation of forming a sealing member 600 according to an embodiment of the present invention. More specifically, FIG. 7 is a cross-sectional view taken along the line VII-VII' of FIG. 6 after forming the sealing member 600.

Referring to FIG. 7, the sealing member 600 is formed on the PCB 10 to surround the first and second semiconductor chips 100 and 200, the interposer 500, and the bonding wires 50. The sealing member 600 may be formed of, for example, an epoxy molding compound (EMC).

Figure 8:
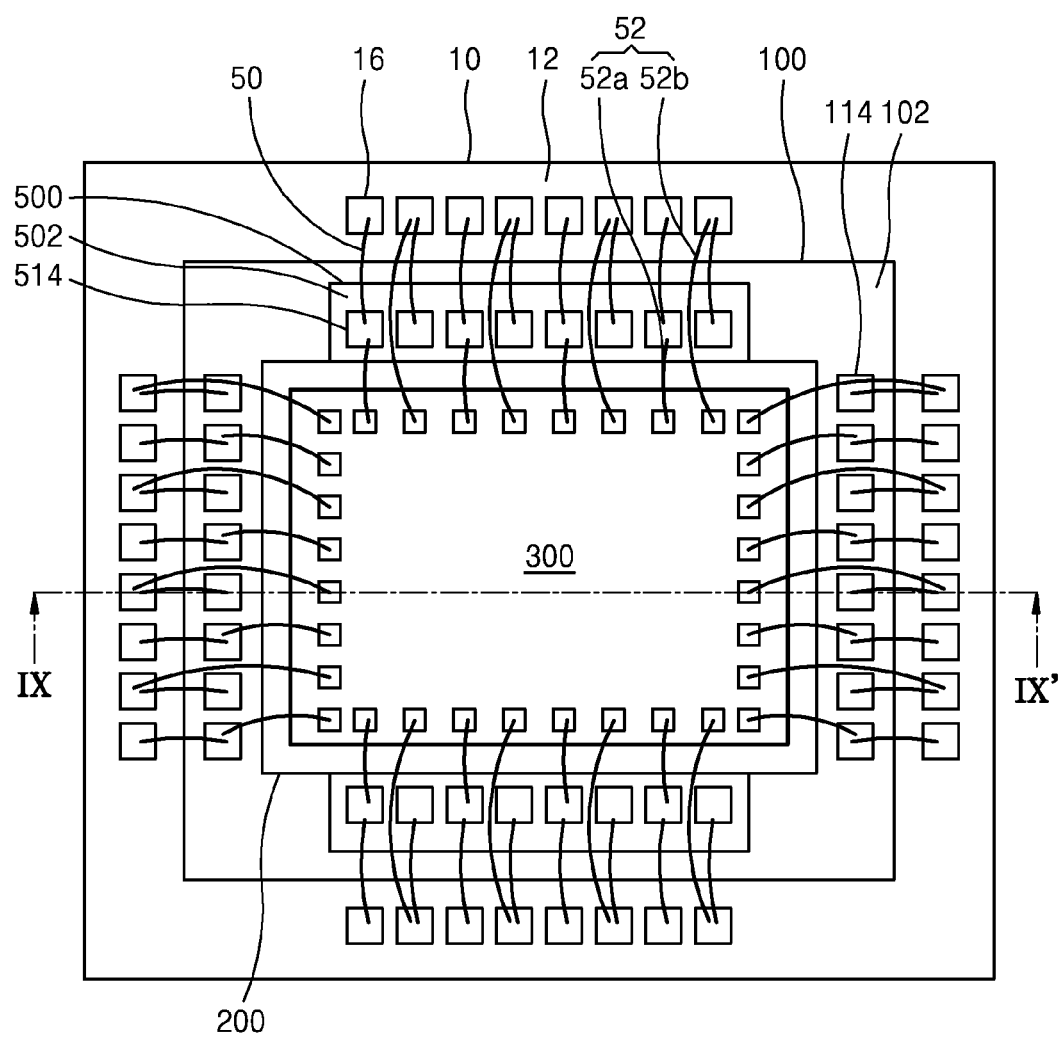
FIG. 8 is a plan view showing an operation of attaching a third semiconductor chip onto a second semiconductor chip, according to another embodiment of the present invention.

FIG. 8 is a plan view showing an operation of attaching a third semiconductor chip 300 onto the second semiconductor chip 200, according to another embodiment of the present invention. FIG. 8 shows an operation after the operations shown in FIGS. 4 and 5.

Referring to FIG. 8, the third semiconductor chip 300 may be attached onto the second semiconductor chip 200. The third semiconductor chip 300 may be attached onto the second semiconductor chip 200 by using a third adhesive member 26. The third semiconductor chip 300 may include a plurality of bonding pads 310 on a third active surface 302, which is opposite to a surface of the third semiconductor chip 300 facing the second semiconductor chip 200.

The third semiconductor chip 300 may be electrically connected to the first semiconductor chip 100 or the PCB 10 through additional bonding wires 52. Each of the additional bonding wires 52 may include a first additional bonding wire 52a that connects the bonding pad 310 of the third semiconductor chip 300 to the second pad unit 114 of the first semiconductor chip 100 and a second additional bonding wire 52b that connects the bonding pad 310 of the third semiconductor chip 300 to the second connection pad unit 514 of the interposer 500.

When the first additional bonding wire 52a is formed, the third adhesive member 26 is disposed between the second semiconductor chip 200 and the third semiconductor chip 300. Therefore, a pressure that is applied to the bumps 210 of the second semiconductor chip 200 may be reduced. Accordingly, damage to the bumps 210 may not occur.

Figure 9:
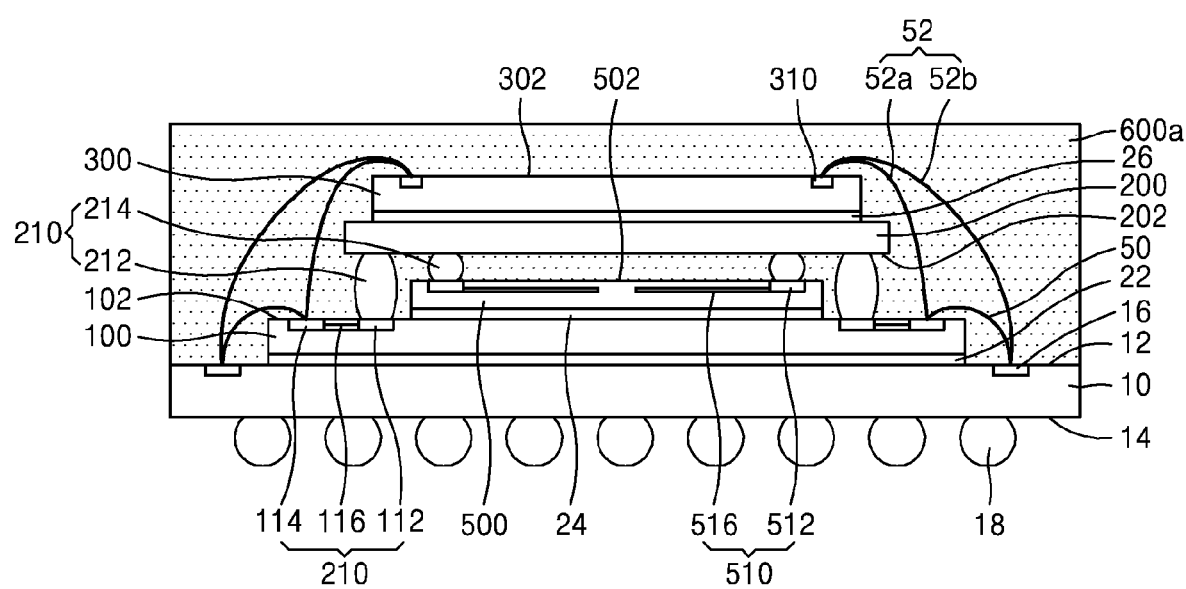
FIG. 9 is a cross-sectional view showing an operation of forming a sealing member according to another embodiment of the present invention.

FIG. 9 is a cross-sectional view showing an operation of forming a sealing member 600a according to another embodiment of the present invention. More specifically, FIG. 9 is a cross-sectional view taken along the line IX-IX' of FIG. 8 after forming the sealing member 600a.

Referring to FIG. 9, the sealing member 600a may be formed on the PCB 10 to surround the first through third semiconductor chips 100, 200, and 300, the bonding wires 50, the additional bonding wires 52, and the interposer 500.

Figure 10:
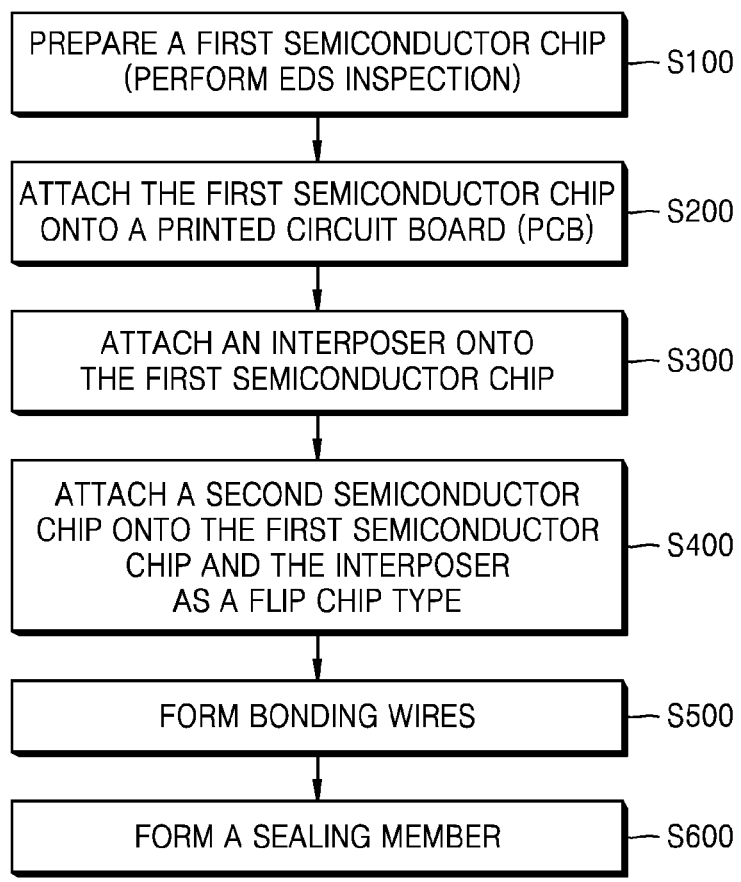
FIG. 10 is a flowchart illustrating a method of manufacturing a semiconductor package, according to an embodiment of the present invention.

FIG. 10 is a flowchart illustrating a method of manufacturing a semiconductor package, according to an embodiment of the present invention.

Referring to FIGS. 1 and 10, the first semiconductor chip 100 is prepared (S100). A plurality of pads 110 are formed on the first active surface 102, which is an upper surface of the first semiconductor chip 100. Each of the pads 110 may include a first pad unit 112 and a second pad unit 114. The first semiconductor chips 100 may be inspected by performing an electronic die sort (EDS) inspection through the first pad units 112 and the first semiconductor chips 100 that have no defects may be selected. As shown in FIG. 7, the first bump unit 212 of the second semiconductor chip 200 may be attached to the first pad unit 112, and the bonding wire 50 may be connected to the second pad unit 114. Damage may occur when an EDS inspection is performed or the bonding wire 50 is formed. However, when the EDS inspection is performed on the first pad unit 112 and the bonding wire 50 is connected to the second pad unit 114, the EDS inspection and the connection of the bonding wire 50 are not performed on the same location. Therefore, damage to the pads 110 may be minimized.

Referring to both FIGS. 7 and 10 together, the first semiconductor chip 100 is attached onto the PCB 10 (S200). Afterwards, the interposer 500 is attached onto the first semiconductor chip 100 (S300). The interposer 500 may be attached onto the first active surface 102 of the first semiconductor chip 100 separately from the pads 110 to expose the pads 110 formed on the first active surface 102 of the first semiconductor chip 100.

Referring to all of FIGS. 4, 5, and 10, the second semiconductor chip 200 is attached onto the first semiconductor chip 100 and the interposer 500 as a flip chip type (S400). The second semiconductor chip 200 may be attached onto the first semiconductor chip 100 and the interposer 500 on which the second connection pad unit 514 of the interposer 500 and the second bump unit 214 of the first semiconductor chip 100 are exposed. The first bump unit 212 of the second semiconductor chip 200 may be electrically connected to the first pad unit 112 of the first semiconductor chip 100, and the second bump unit 214 may be electrically connected to the first connection pad unit 512 of the interposer 500.

Referring to both FIGS. 7 and 10, the bonding wires 50 that electrically connect the first semiconductor chip 100 to the PCB 10 or the interposer 500 to the PCB 10 are formed (S500). The bonding wires 50 may electrically connect the second pad units 114 of the first semiconductor chip 100 to the connection terminal units 16 of the PCB 10. The bonding wires 50 may electrically connect the second connection pad units 514 of the interposer 500 to the connection terminal units 16 of the PCB 10. Afterwards, the semiconductor package may be formed by forming the sealing member 600 on the PCB 10 to surround the first and second semiconductor chips 100 and 200, the interposer 500, and the bonding wires 50 (S600).

When a semiconductor package according to the present invention is formed by stacking a plurality of semiconductor chips, electrical connections between the semiconductor chips may be freely designed by using an interposer. Also, damage to bumps may be avoided although semiconductor chips connected by bonding wires are stacked on semiconductor chips connected by a flip chip type.

Also, in the method of manufacturing a semiconductor package, according to the present invention, an EDS inspection for checking the soundness of semiconductor chips may be performed in a preparation operation of the semiconductor chips. Also, since the location of pads used for EDS inspection and the location of the pads connected to the bonding wires are different, damage to the pads may be minimized, and accordingly, semiconductor packages having high reliability may be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A semiconductor package comprising:
a printed circuit board (PCB);
a first semiconductor chip attached onto the PCB;
an interposer that is attached onto the first semiconductor chip to cover a portion of the first semiconductor chip and comprises first connection pad units and second connection pad units that are electrically connected to each other, respectively, on an upper surface opposite to a surface of the interposer facing the first semiconductor chip;
a second semiconductor chip attached onto the first semiconductor chip and the interposer as a flip chip type;
a plurality of bonding wires that electrically connect the second connection pad units of the interposer to the PCB or the first semiconductor chip to the PCB; and a sealing member formed on the PCB to surround the first semiconductor chip, the second semiconductor chip, the interposer, and the bonding wires;

wherein the first semiconductor chip comprises a plurality of pads on a first active surface opposite to a surface facing the PCB, and each of the pads comprises first pad units connected to the second semiconductor chip and second pad units connected to the bonding wires, whereas the first pad units and the second pad units are electrically connected to each other, respectively.

2. The semiconductor package of claim 1, wherein the second semiconductor chip comprises:

first bump units that are formed on a second active surface that faces the first semiconductor chip and the interposer and are connected to the first pad units of the first semiconductor chip and second bump units that are connected to the first connection pad units of the interposer, and the first bump units have a height greater than that of the second bump units.

3. The semiconductor package of claim 2, wherein the interposer has a thickness smaller than the height of the first bump units.

4. The semiconductor package of claim 2, wherein the first bump units of the second semiconductor chip are spaced apart from edges of the upper surface of the interposer.

5. The semiconductor package of claim 1, wherein the interposer is attached onto the first semiconductor chip separate from the pads of the first semiconductor chip, and the second semiconductor chip is attached on the first semiconductor chip and the interposer exposing the second connection pad units of the interposer.

6. The semiconductor package of claim 1, further comprising:

a third semiconductor chip attached onto the second semiconductor chip; and a plurality of additional bonding wires that electrically connect the PCB to the third semiconductor chip or the second connection pad units of the interposer to the third semiconductor chip, and the sealing member is formed to surround the third semiconductor chip and the additional bonding wires.

7. A method of manufacturing a semiconductor package, the method comprising:

preparing a first semiconductor chip that comprises a plurality of pads each comprising first pad units and second pad units, which are electrically connected to each other, respectively;

attaching the first semiconductor chip onto a printed circuit board (PCB) exposing the pads;

attaching an interposer that comprises a plurality of pads each having first connection pad units and second connection pad units that are electrically connected to each other, respectively, on the first semiconductor chip exposing the pads;

attaching a second semiconductor chip that is connected to the first pad units of the first semiconductor chip and the first connection pad units of the interposer as a flip chip type;

forming bonding wires that electrically connect the second pad units of the first semiconductor chip to the PCB or the second connection pad units of the interposer to the PCB; and forming a sealing member on the PCB to surround the first and second semiconductor chips, the interposer, and the bonding wires;

wherein the plurality of pads of the first semiconductor chip are on a first active surface opposite to a surface facing the PCB, and wherein the first pad units of the first semiconductor chip are connected to the second semiconductor chip and the second pad units of the first semiconductor chip are connected to the bonding wires.

8. The method of claim 7, wherein the second semiconductor chip comprises first bumps and second bumps, the attaching of the second semiconductor chip comprises connecting the first bumps to the first bump units and the second bumps to the first connection pad units.

9. The method of claim 7, wherein the preparing of the first semiconductor chip comprises performing an electronic die sort (EDS) inspection on the first semiconductor chip through the first pad units.

* * * * *